United States Patent [19]

Holtmann

[11] Patent Number: 5,310,574
[45] Date of Patent: May 10, 1994

[54] METHOD FOR SURFACE MOUNT SOLDER JOINTS

[75] Inventor: Damian J. Holtmann, Danbury, Conn.

[73] Assignee: Mask Technology, Inc., Santa Ana, Calif.

[21] Appl. No.: 881,872

[22] Filed: May 12, 1992

[51] Int. Cl.⁵ .............................................. B05D 1/00
[52] U.S. Cl. ........................................ 427/58; 427/96; 427/369; 427/370; 427/374.4; 427/376.7
[58] Field of Search ................ 427/58, 96, 369, 374.4, 427/376.7, 370

[56] References Cited

U.S. PATENT DOCUMENTS 5,051,339 9/1991 Friedrich .............................. 427/96

OTHER PUBLICATIONS

W. J. Maiwald "Reliable Reflow Soldering Techniques using Preformed Solid Solder Deposits—Part 2-The Assembly Process", date is unknown.

M. Weinhold "... Part 1—The Printed Circuit Fabrication Process" Date is Unknown.

Primary Examiner—Shrive Beck
Assistant Examiner—Vi Duong Dang
Attorney, Agent, or Firm—Richard T. Holzmann

[57] ABSTRACT

A method and apparatus for the forming of a solder deposit on an SMD pad on a printed circuit or hybrid board. This formed solder deposit is in a defined three-dimensional well having the proper profile and a defined solder gap. The solder before forming can be solid solder or a solder paste. By the placement of a mesh on the surface of the circuit board with the solder in place on the pads, applying a slight positive pressure on a rigid or elastic surface on the other side of the mesh, and subjecting this system to a temperature just low enough to reflow the solder by means of a heat transfer fluid, then cooling the board to solidify the solder, a product results having the above properties. The duration of the application of heat and pressure is made so brief, that the laminate structure of the board and the coating thereon remain substantially unaffected. A circuit board with the solder so formed thereon.

18 Claims, 5 Drawing Sheets

METHOD FOR SURFACE MOUNT SOLDER JOINTS

BACKGROUND OF THE INVENTION

1. Field of the Invention

The invention relates to a method for the forming of a solder deposit on an SMD pad on a printed circuit or hybrid board. This formed solder deposit is in a defined three-dimensional well having the desirable profile and a defined solder gap. It is immaterial whether the solder before forming is solid solder or a solder paste. By the placement of a mesh on the surface of the circuit board with the solder in place on the pads, applying a slight positive pressure on a rigid or elastic surface on the other side of the mesh, and subjecting this system to a temperature just low enough to reflow the solder by means of a heat transfer fluid either liquid or gaseous, then cooling the board to solidify the solder, a product results having the above properties. The invention also relates to apparatus for forming this solder deposit as well as a circuit board with the solder so formed thereon.

2. The Prior Art

Various methods are known for applying solder selectively to printed circuit boards (PCBs) in such a way that following the assembly of the boards with Surface Mount Device (SMD) components, the boards can be electrically and mechanically connected to the components by reflow soldering methods.

In particular, the prior art uses a method in which the solder deposit is applied to the selected regions of the PCB in the form of a deposit of solder by screen printing or stencil printing with soldering pastes. While this method is in common use today, nevertheless, in many respects, this method cannot be considered optimal:

1—the investment cost of screen printing machines, screens and masks or stencils required is considerable;

2—the screens or stencils that must be used wear regularly;

3—the entire screen printing process must be monitored continuously because it cannot be precluded that the screens used may become plugged in some regions;

4—so-called thin solder deposits are often produced, which can mean low or no mechanical and thermal load capacity for the solder connections based on them;

5—thixotropic properties change while pastes are exposed to variations in temperature, humidity, evaporation of solvent and shearing conditions;

6—soldering pastes are expensive;

7—the resolution of the screen printing method is limited; and

8—the optoelectronic positional recognition of assembly systems involves great difficulties not only because of solder paste deposits that do not properly match the intended contour resulting in deviations in production, but also because of movement of the PCB itself.

9—The flexibility of interlinked production lines having screen printing is greatly impaired because these machines entail considerable set-up times and adjustments.

10—Moreover, the heating speed of the introduction of heat in reflow soldering with solder pastes has proven to be limited, because in the heating process, volatile ingredients and solvents from the paste have to evaporate which takes time.

11—Other disadvantages associated with solder paste are: a)bubble formation, b)oxidation of the soldering paste, c)fine granulation and the like.

Another previously used method in the prior art is known as immersion application of solder to PCBs. In this method, a prepared PCB is dipped into and removed from a solder bath. After being removed and following a cooling down phase, the metallized regions of the PCB provided with a solder resist means are provided with a solder deposit, which, however, has a more or less convex cross-sectional shape; this rounded surface forms because of the high surface tension of solder. The height of the solder deposit is also dependent on the dimensions in the plane of the PCB of the regions to which solder is to be applied, so that when such regions have different dimensions, variably high solder deposits necessarily result.

U.S. Pat. No. 5,051,339 issued Sep. 24, 1991 Friedrich et al., the so-called "OPTIPAD" process, is an attempt to overcome some of these disadvantages. Because this is an immersion process, there are no foreign ingredients, that is, no ingredients but solder in the solder deposits.

The process, simply stated, involves procuring a PCB having thereon a solder mask with pads exposed, laminating thereto a photoimageable layer of perhaps 5 mil in thickness, exposing and developing so that everything is masked but the pads to be soldered, immersing the thus prepared PCB into molten solder, and then contacting the board with a closure element to maintain the solder in place until it solidifies. Optionally, the limiting layer, a photoimageable solder resist mask or a regionally applied foil layer, can be left on if the component has leads which must be connected to the pads or can be removed if SMD lead-less components are used.

This patentee has pointed out that the use of hot air or hot oil leveling is not considered to be close prior art, whereas immersion solder application without ensuing air leveling is.

Some of the specifics of this invention are as follows:
solder bath temperature=250 degrees C.;
optionally apply flux prior to immersion;
optionally apply a primary application of solder;
optionally supply turbulence in the solder bath;
optionally employ closure elements with elastic surfaces;
closure elements must not be wettable by solder;
closure elements may have a deformably embodied closure surface, pressed into the voids located above the regions to which solder is to be applied;
optionally have different temperature zones for quenching.

The coating of the PCB with the temporary soldering top mask is considered to be an indispensible part of the invention. The reason the patent application was allowed to issue was that the closest prior art did not contain the step of covering, with at least one closure element at a defined contact pressure, the voids located above the regions to which solder is to be applied when filled in the soldering bath with liquid solder.

The "OPTIPAD" process requires the use of a 5 mil temporary coating which is imaged, developed where the pads are and then immersed in molten solder. Others are attempting to modify this process by screening the molten solder into the pad wells. Stripping the temporary layer leaves behind a 5 mil high pillar of solder. Aside from the need for expensive equipment which is not commercially available, this process has two major problems:

1—When the temporary coating sees molten solder it cures extensively and is difficult to remove even when stripping with caustic soda which has the other effects of not only dulling and oxidizing the solder, but of attacking the permanent mask.

2—When the 5 mil solder mask is stripped it leaves pillars of solder which in fine pitch applications when mated with their components collapse and generate extensive shorts.

3—Any attempt to reduce the thickness of the mask in order to reduce the height of these pillars would result in a greater degree of curing and an even more difficult stripping operation.

In addition to the '339 patent mentioned above, there are two other relevant publications; a paper by W. J. Maiwald of Siemens entitled, "Reliable Reflow Soldering Techniques using Preformed Solid Solder Deposits, Part 2—The Assembly Process" and the joint paper by M. Weinhold of DuPont entitled, ". . . Part 1—The Printed Circuit Fabrication Process".

The "SIPAD" process of Siemens combines a few known technologies and produces a flat solid solder deposit on the PCB. The processing steps are applying solder pastes onto boards with permanent solder masks, melting of the solder paste and flattening of the round, humped solder deposits by a thermal/mechanical process.

The major problems which both the "OPTIPAD" and the "SIPAD" processes have attempted to address are the following:

1—opens and shorts, squeezing out of solder and resultant solder bridging; this latter occurs at assembly in the "OPTIPAD" process, and while flattening in the "SIPAD" process 2—low packing density and inability to solder with high pin counts without extensive design modifications 3—the printing of solder paste:
 with respect to solder paste, screen printing has already reached its limit;
 inability of the paste to maintain its profile after printing, therefore
 all the peripheral problems associated with paste and screening;
 buried defects in reflowed soldered joints using paste which can only be seen by X-ray examination;
 these defects also due to failure of some components of the paste to fully evaporate during pre-heating or reflow, with
 consequent solder joints with reduced peel strength; requirement for highly activated fluxes;

4—achieving the required shape of the deposit;

5—presence of a "hump", the meniscus, makes positioning of fine pitch components difficult resulting in unacceptable tolerances;

6—solder balls;

7—shelf-life of solder joint; short storage times;

8—poor solderability due to too thin deposits. Hot Air Solder Leveling is notorious for leaving thin deposits, with consequent growth of an intermetallic phase preventing wetting of the SMD solder pads during reflow or wave soldering;

9—poorly defined soldering gap;

10—inability to quantify and standardize solder deposit and solder gap;

11—yield after soldering. First-pass yields in standard applications are running at 60–70%, while for many fine pitch cases they are only 10%; rework is extensive;

12—overall cost;

13—quality of board and solder joint.

The solutions and benefits both of these approaches have attempted to achieve are as follows:

1—removal of the solder paste printing process from the assembler's operation; the PCB fabricator can supply to the assembler circuits with a solid, flat solder deposit. New processes can be used to replace solder paste printing and which obviate the need for cleaning the PCB assemblies without the risk of solder balls or other contamination;

2—guaranteed reflow solderable PCBs;

3—unlimited good solderability of the PCB;

4—small solder structures;

5—a defined solder gap; solder in a defined three-dimensional well, i.e., an excellent profile;

6—assembler would then use a 100% tested presoldered board since faults arising from solder application can be separately controlled, eliminated or reworked at the PCB fabricator without the obstruction of components;

7—the problem of solder paste deposits being deformed when the component terminals touch down is non-existent with this method. Components can be placed on a flat surface which would permit the use of fine-pitch flat packs and TAB assembly with automated equipment;

8—finer PCB structures can be implemented;

9—practically no shorts;

10—no solder balls;

11—too thin solder layers are not encountered;

12—fluxing agents can be optimized;

13—unlimited shelf-life between placement and soldering; longer guaranteed storage time; reduction in growth of the intermetallic phase resulting in higher peel strength;

14—the possibility of quantifiable and standardized solder deposits and solder joints;

15—better yield after soldering with considerable reduction of rework; higher first pass yields;

16—better overall quality of boards and solder joints; improved product consistency;

17—lower cost due to faster throughput in assembly with shorter SMD assembly lines.

Neither of these two processes, i.e., the "OPTIPAD" nor the "SIPAD", have been completely successful. The "OPTIPAD" process is run in an extremely aggressive environment, that is, molten solder at 450 degrees F. As a consequence, the so-called limiting layer or temporary film is severely cured and cannot easily be removed even with strong caustic solution. In the worst case, the permanent mask is also damaged. Attempts to resolve this by screening molten solder have had not only the same problem but in addition there is severe dulling of the solder undoubtedly due to its oxidation. As a consequence, any solder joint formed therefrom would probably have a short storage life due to intermetallic phase formation. Furthermore, this process requires the development of unique and expensive equipment for its implementation.

"SIPAD" also requires highly specialized equipment although attempts are being made to run this process in a conventional multilayer press normally used for PCBs. The problem here is that this type of press requires about 2000 psi before activation, and though the platens see the top of the solder first, they then contact the PCB itself and thermally shock the laminate, oftentimes scorching and mechanically damaging the solder mask as well. Furthermore, the solder when compressed, squeezes sideways as a very thin film or foil. While this problem can be solved by various techniques to remove the film, it results in extensive and expensive rework and fine droplets of the thus squeezed out solder end up as solder balls.

On the other hand, the "SIPAD" process uses the solder in the well to solder not the pillar of "OPTIPAD"; the process of this invention uses both.

Since solder "wicking" can be either sideways or upwards, in order for Siemens to achieve their maximum densities on fine pitch, they must change the design of their pads by elongating them. Since they are a company completely integrated vertically, this can be done by their designers, not so with the majority of OEM's. Wicking upwards is, of course, desirable; sideways is not.

In summary, both of these new processes leave much to be desired and are not practical in their present state of development. As a consequence, the study which resulted in this subject invention was undertaken.

SUMMARY OF THE INVENTION

This invention eliminates most of the problems of other approaches in that the heating is very uniform and the dwell time at temperature is short. In the "SIPAD" process, for example, the hot platen first contacts the bumps, the solder melts and the plate then contacts the board, shocking it, thereby potentially causing measleing, delamination, solder mask blistering and fracture. With a heat transfer fluid, all surfaces are in contact at the same time and at the same temperature, thermal decomposition of the laminate does not ensue probably due to the lack of oxygen in the fluid environment. It must be remembered that with these flattening processes, the boards see one additional soldering; the less they are subjected to heat, the better. Normal soldering techniques do not exert any mechanical force on the boards, but these techniques must; this invention exerts very little, "OPTIPAD" must use more and "SIPAD" uses the most in a multilayer press which is about 2000-3000 psi.

A most important feature of this invention is that the heat transfer fluid/mesh technique works regardless of how the original solder deposit is laid down, e.g., by electroplating, by immersion in a molten solder bath, by screen printing a solder paste, or however. It works as long as the solder is there, be it as solid solder, solder paste, or whatever. Furthermore, the fluid acts as a release agent allowing easy removal of the mesh from the solder after cool-down.

The mesh . . .

1—is a conduit for bubbles, allowing the outgasses to be evacuated.

2—contains the solder deposit in the x, y, and z directions.

3—shapes the solder deposit.

4—fills the well with solder.

5—increases pad size slightly thereby presenting an easier "target" for placement of the SMD.

6—allows a pad to hold more flux prior to assembly than a perfectly planar one.

7—count, as well as the thickness, wire diameter and the weave, can be varied from approximately 60-300. A sample of production lots would be required to optimize performance.

8—creates pad shapes which are irregular but, nevertheless, give optimum performance.

9—is being used as a die [mold] for the solder or paste and can "capture" even inordinately high volumes of solder. Therefore, the need to blast off squeeze out or scrub with a stiff nylon bristle brush, possibly damaging the permanent solder mask and requiring extensive rework, is eliminated. Foil formation is eliminated by proper selection of mesh.

10—eliminates the need for thicker [4 mil] or removable [5 mil] solder mask.

11—produces a grid pattern on the top surface of the solder which is the impression of the mesh itself; it is not flat. Actually, this grid pattern should improve adhesion of components at assembly since it can hold more sticky flux.

12—performs its function whether the substrate is a printed circuit board laminate or a ceramic hybrid or wherever else solder is applied, so long as the substrate can withstand the temperature, the slight pressure and the environment of the heat transfer fluid.

In this invention, the "bumps", or whatever configuration the surface of the solder deposit is in, contact the plates in the manual apparatus due to the pressure of springs only . . . these springs are actuated by the handle locking and unlocking, this allows circulation of the fluid below them. This permits rapid and intimate heat transfer unlike in the absence of fluid where thermal "shock" is normal because of the intimate contact with very hot metal. The cycle time is only about 2 minutes. The fixture device is shown in the drawings. The system lends itself easily to automation.

When the bumps are squeezed they assume a shape as a function of the size and shape of the mesh openings and of the weave. As the component is placed [with adhesive or "sticky" flux for example], the board goes to reflow [inert gas, hot air, IR or whatever]; the solder, which now is in a shape controlled by the mesh, protrudes above the board thereby "finds" the metal leads which are typically solder or Sn, and wets the surface.

Uneven pressure on the plates is not significant so long as they are in planar contact. The spring pressure is very modest; the springs used can easily be compressed by hand; too much pressure will increase the squeeze out. Alternatively, electromechanical, pneumatic or hydraulic-actuated systems could vary this slight pressure to adjust to part numbers with varying configurations if required. It should be noted that a multilayer press was not designed for this gentle operation. Normal cycle time is about 3 hours in such a press, but even when you reach the pressure necessary to press, one must make a slight additional increase in pressure since the pressure is applied incrementally and a slight additional pressure is necessary to bring the plates into flat contact. It should be emphasized that in the "SIPAD" process, mask is easily scorched, laminate "burned" and mechanical stress is exerted on the permanent solder mask over the circuits, in addition to the extensive foil formation.

The concept is to lock-in the area into which the solder can travel thereby preventing sideways squeezing and promoting squeezing upwards (as well as downwards should there be insufficient solder in the well). The solder is then formed in a most desirable configuration. The mesh material may be of conventional stainless steel wires, glass cloth or a chemical milled screen or even a laser-machined plate in a configuration so that it behaves like a screen preventing sideways flow and promoting flow upward.

The main features being that the spreading of solder is prevented, solder balls do not form, the well is filled, low volume solder deposits are optimized and all this is done at an exposure to a rapid and uniform temperature thereby preventing deterioration of the mask and the board.

Assembly operations today are fully automated except for the application of solder paste. This kind of technology is alien to the assembler and more properly belongs in either the PCB fabricator's shop or in a service bureau. The solder paste itself consists of balls of solder essentially held together in a system with about 25–50% solvent-carrier. The paste also has a relatively short shelf-life aggravating the problems in its handling. Wave soldering is not a solution since many components cannot be subjected to wave conditions. Furthermore, conventional wave soldering generates a "shadow" when the leads are facing the wave head-on making component soldering difficult unless double soldering is employed. However, this invention is independent of whether the solder has been applied by wave, bar or laser techniques.

In a typical current process, solder paste is screened onto the bumpy surface; a pick-and-place machine places the components and the machine stops when in contact with the bumps. However, in low pitch applications, the solder paste deposit will displace sideways and contact another bump shorting the circuit. The "SIPAD" process eliminates this and reportedly can result in producing twice as dense boards.

Getting paste out of assembly increases productivity greatly due to its automatic nature, save for the paste application. Reflow is speeded up and simplified since the impurities in the paste, which cause outgassing and produce solder balls, are already removed.

This process not only eliminates solder balls and squeeze out of excess solder, but even shapes the excess solder into a more desirable form for the mating with surface mount components. Furthermore, the well is filled, any outgassing is controlled and should little solder be present, it is formed to optimize its volume. Additionally, there is no need to modify board design, i.e., land configurations, solder mask or stencil artwork, etc., currently used; the method and apparatus accomodates itself to existing topographies.

BRIEF DESCRIPTION OF THE DRAWINGS

The invention of the present application will now be described in more detail with reference to the preferred embodiments of the device, given only by way of example, and with reference to the accompanying drawings, in which.

DESCRIPTION OF THE PREFERRED EMBODIMENTS

Figure 1:
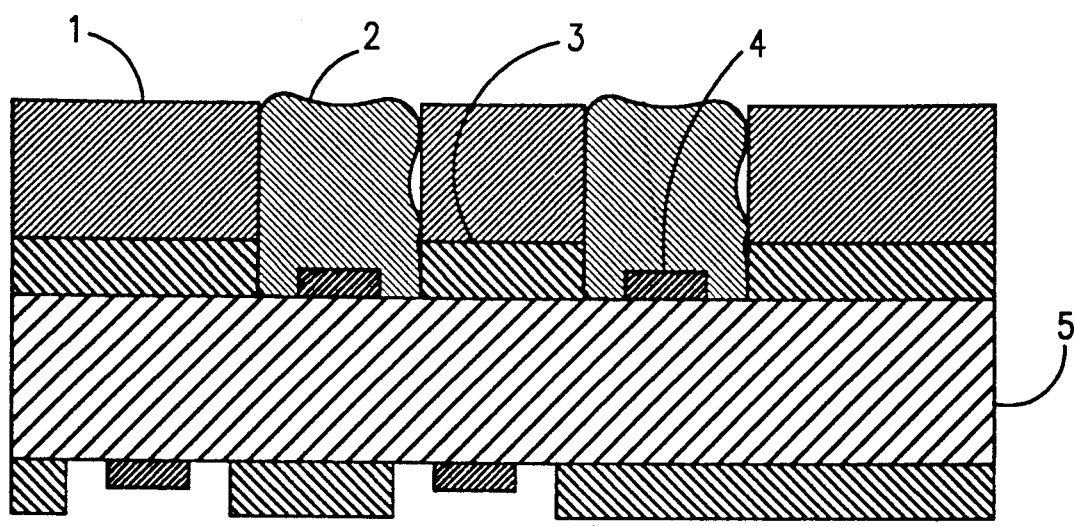
FIG. 1 is a schematic view of the "OPTIPAD" configuration with the temporary mask in place.
Figure 2:
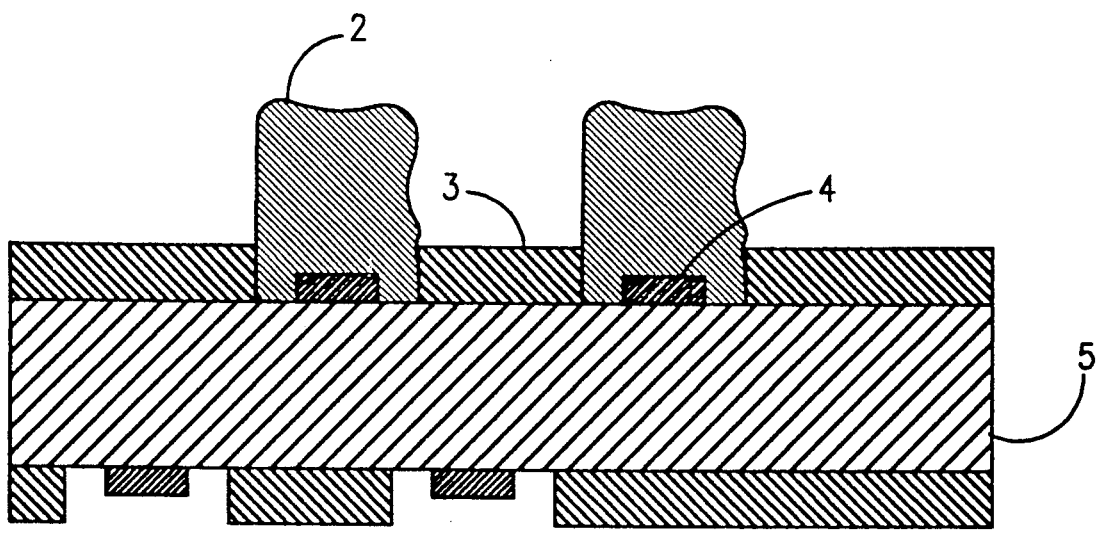
FIG. 2 is a schematic of the "OPTIPAD" configuration with the temporary mask removed.
Figure 3:
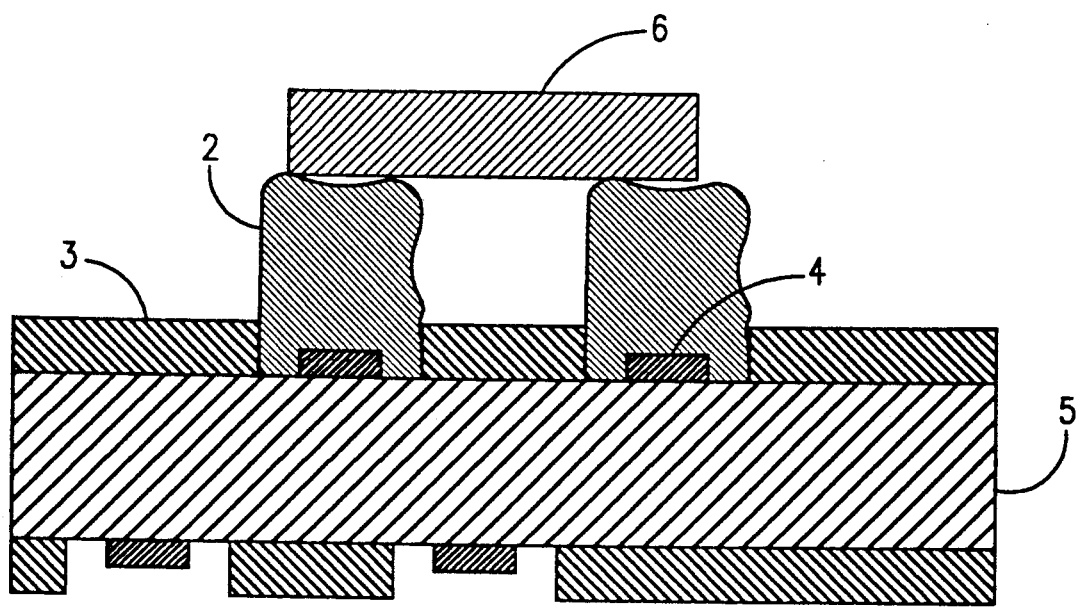
FIG. 3 is a schematic of the "OPTIPAD" with a component placed thereon before reflow soldering.
Figure 4:
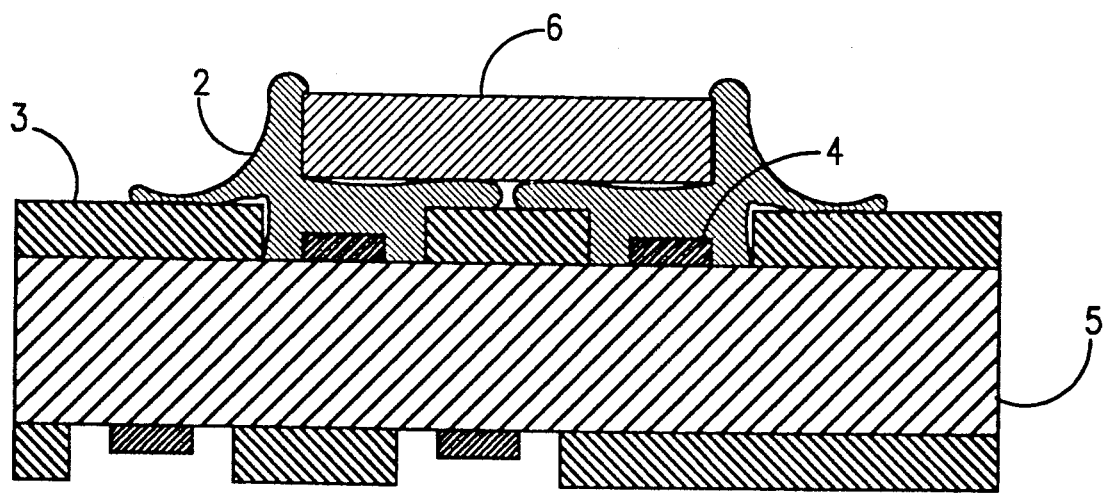
FIG. 4 is a schematic of the "OPTIPAD" with a component in place after reflow soldering.

The heat transfer fluid/mesh technique of the preferred embodiments has essentially five major features:

1—uniform heating at a temperature only slightly above the melting of the solder;

2—gentle application pressure;

3—protection of the laminate, the board and the permanent solder mask during the forming of the solder;

4—the release agent character of the fluid allowing easy separation of the mesh from the solid solder after cool-down; and 5—the ability to maintain a proper form of the solder despite variations in the amount present.

The results achieved in this invention were the outcome of a stepwise development program which encountered a number of failures though many of these failures themselves may be considered to be improvements over current technology.

The development work was largely an attempt to overcome the known weakness of the "OPTIPAD" and "SIPAD" processes. Both of these processes use direct contact of a hot metal plate with the PCB surface to flatten the solder bump.

"OPTIPAD" is known to have great problems in the actual deposition of molten solder as well as extensive curing of the temporary mask making it difficult if not impossible to remove this temporary mask since it is extensively cured. Referring first to FIG. 1, FIG. 2, FIG. 3 and FIG. 4 of the "OPTIPAD" process, the reference numeral 1 denotes the temporary mask, numeral 2 solder, numeral 3 the permanent mask, numeral 4 a pad, numeral 5 the PCB laminate and numeral 6 a component.

Figure 5:
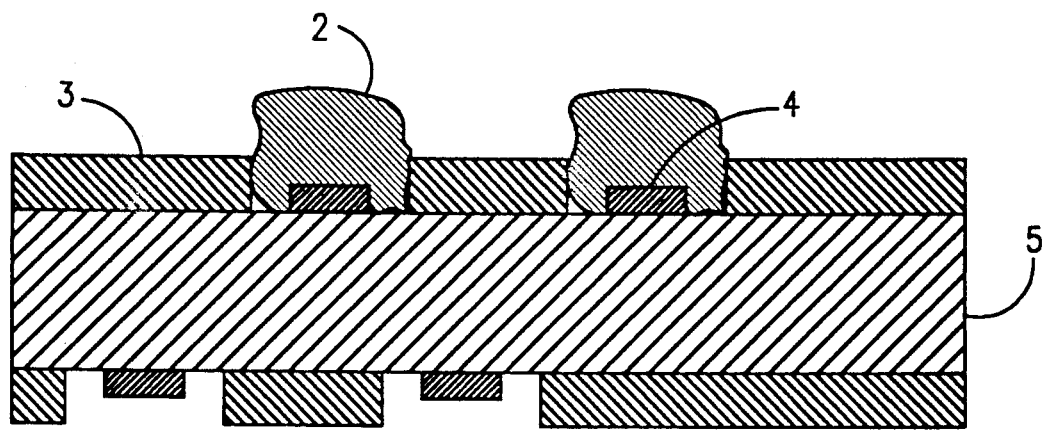
FIG. 5 is a schematic with the solder or solder paste applied and after reflow.
Figure 6:
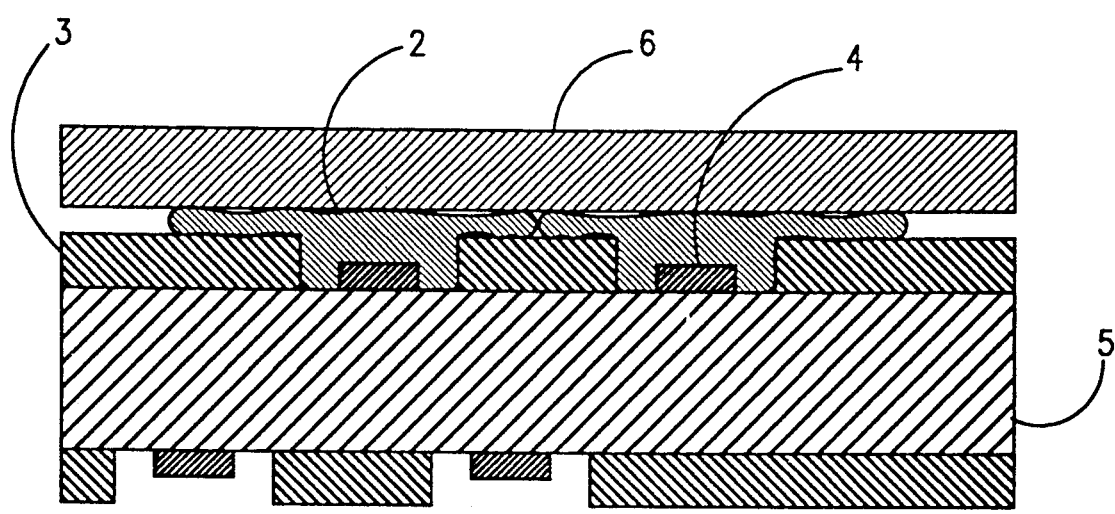
FIG. 6 is a schematic of the "SIPAD" configuration after flattening.

In the "SIPAD" process, which reflows solder paste, one of the main problems is the very high rate of squeeze out of the solder which requires nearly 100% rework. This is illustrated in FIG. 6 wherein the numerals are as above with the addition of the pressure plate reference numeral 6. FIG. 5, having the same reference numerals as above, is a schematic showing the solder bumps resulting from reflowed solder or solder paste, which bumps have been the stimulus for these inventions.

Figure 7:
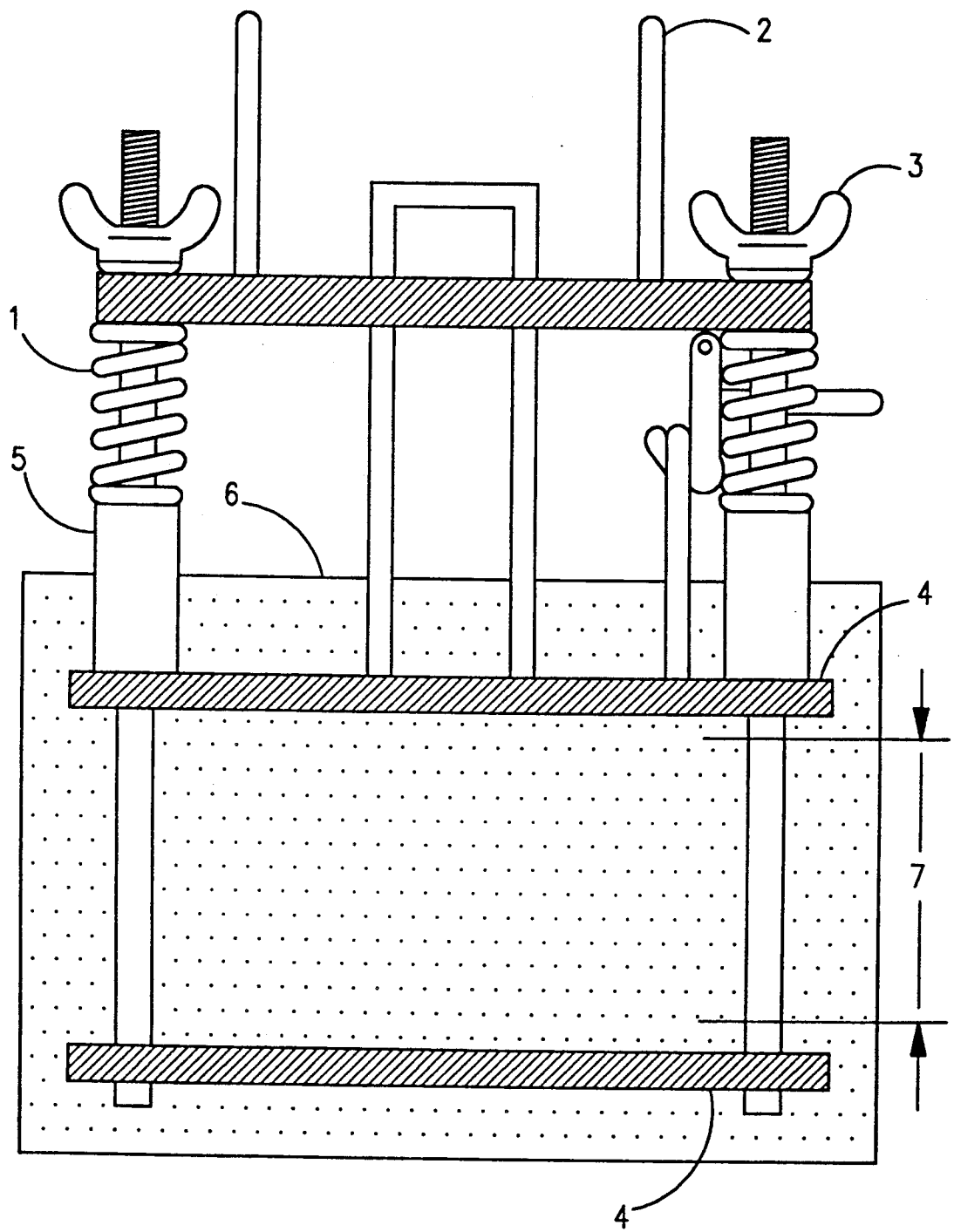
FIG. 7 is a schematic of the fixture used in this invention for simultaneously heating and compressing the PCB.

This investigation sought to mitigate this harsh metal contact by the use of a heat transfer fluid [a hot synthetic oil in most cases] and the substitution of various pressure and auxiliary plates, the auxiliary "plates" being polymer or rubber interfaces between the pressure plate and the PCB. FIG. 7 is a schematic of the fixture of this invention (in a tank of heat transfer fluid) used to contain the PCB sandwich, in which reference numeral 1 represents the springs, 2 stainless steel rods, 3 fastener nuts, 4 aluminum pressure plates, 5 shims to keep the springs out of the heat transfer fluid 6, and reference 7 the opening for receiving the PCB sandwich.

1—With reflowed paste and a "KAPTON" film [to contain solder squeeze out] plus the metal plates, solder foil formed anyway.

2—With lamination in a commercial Solder Mask Vacuum Laminator of a 4 mil "VACREL" 8040 [a DuPont trademarked product widely used as a dry film resist] temporary film over the permanent 2.5 mil 8040, extensive squeeze out occurred and severe curing and blistering of the temporary film so that it could not be removed.

3—Vacuum Lamination using a rubber bladder backed up by plates, again resulted in extensive foil formation and a rubber residue remained on the board. Proper selection of a high temperature rubber solves the deposition problem but not the squeeze out.

4—Aluminum Foil— foil formation and wrinkles in the solder;

5—Aluminum Plates—foil formation and galvanized, dull-looking finish on the solder; highly polished aluminum resolved the finish problem.

6—Stainless Steel Plates—foil formation and the grain of the highly polished steel plates were on the solder; also required longer dwell time and cool-down due to its heat transfer characteristic.

7—Glass Plates—produced a shiny and reflective solder surface. One could see the outgassing and the foil formation as it developed.

During the course of these experiments fluid temperatures and cycle times were varied without any significant beneficial effect. It should be mentioned that when there was foil formation, oftentimes an 1100 psi water spray would remove it . . . but usually incompletely. Any remaining small specks of solder would convert to solder "balls" upon reflow potentially causing shorts on assembled boards.

The conclusions from these experiments follow.

1—Any planar pressure plate alone will cause squeeze—out [foil formation] so long as there is excess solder present. In these experiments, our pressure plate is actually a film of hot heat transfer fluid.

2—The ideal situation is to conduct the forming rapidly and at as uniform a rate of heat rise as possible, adequate to reflow the solder while not shocking and scorching the laminate or curing a temporary mask. In these experiments temperatures of 450, 425, 405 and 390 degrees Fahrenheit were used and 385–405 seems to be optimum. Cycle times were of the order of 2–3 minutes.

3—Reflowed solder with a shiny surface is apparently the most desirable, reflecting no change in the eutectic ratio of optimum Sn/Pb composition. A dull surface usually means either oxidation of the solder or an enrichment of Pb at the surface.

4—What is required is something to prevent squeeze—out, something which is not a continuous planar pressure plate.

Screening equipment used today in the assembly plants handles the boards by the edge to allow for screening the backside with components thereon. If one does as above, the entire operation is greatly simplified and with a much superior finished product.

Figure 8:
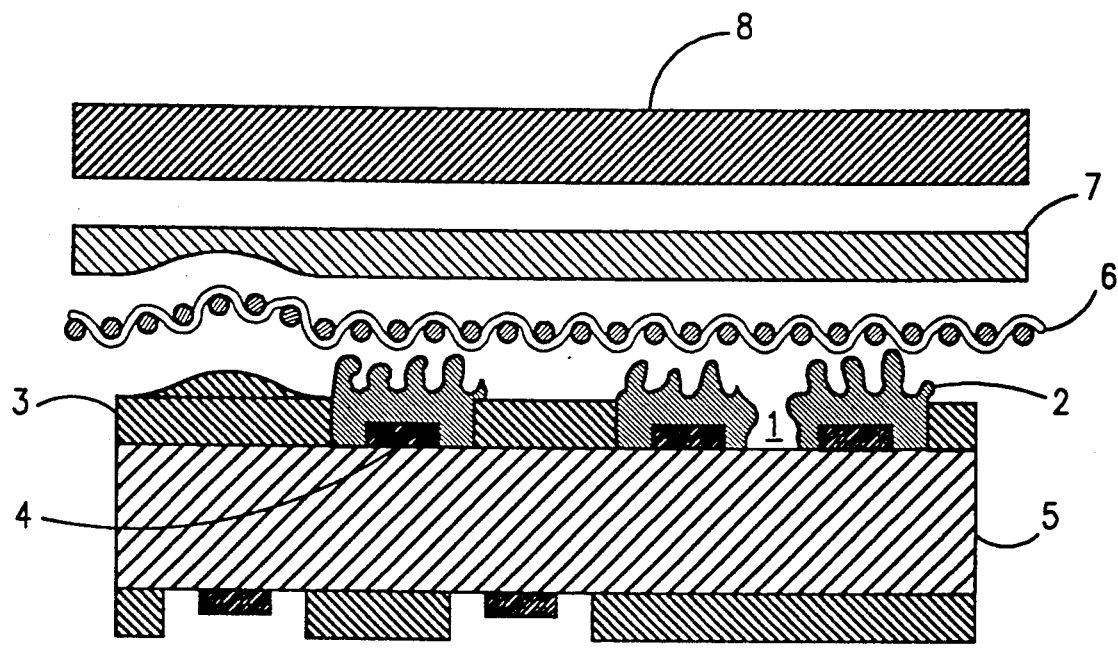
FIG. 8 is a cross-section of the sandwich of this invention prior to closure.
Figure 9:
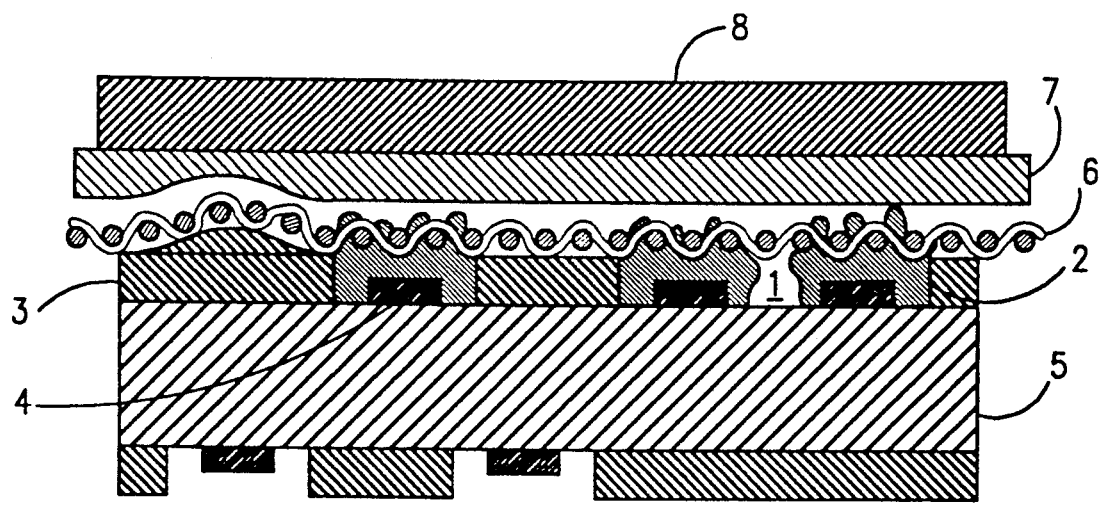
FIG. 9 is a cross-section of the sandwich of this invention after closure.

The most significant development, i.e., the use of a MESH covering the surface of the board, immediately gave excellent results. Not only did the foil disappear, but as important, the mesh not only caused the excess solder to rise up, but to flow down the well thereby forming a most desirable solder configuration. FIG. 8 is a cross-section schematic of the PCB sandwich of this invention prior to closure, while FIG. 9 is a cross-section of the sandwich in the closed position. Referring to these figures, 1 is a gap, i.e., an open area between the pads where no solder dam is required, 2 is solder, 3 the permanent mask, 4 a pad, 5 is the PCB laminate, 6 the mesh, 7 a sheet of rubber and 8 the aluminum planar plate.

This technique, as evidenced by micro-sectioning, resulted in filling the well assuring one of a superior solder joint. The height of the thus formed solder will also require less pressure to achieve wetting of the surface mount component. Incidentally, while all that is needed is to lay the mesh on the board surface, a slight tension on the mesh produces a slight improvement.

The pressure required in the fixture can easily be achieved by hand. The use of a rubber sheet between the mesh and the pressure plate resulted in a slight further improvement due to its ability to conform to the topography of the board. It did appear to be beneficial with low solder deposits by preventing the solder to rise too far, and made it easier to peel the board off at the end of the treatment.

Repeating all the above experiments utilizing the mesh on reflowed solder similarly gave excellent results.

Subsequently, an experiment was run wherein a screened solder paste, without being reflowed, was covered with mesh, placed in the fixture and subjected to the hot heat transfer fluid under pressure. The results were also excellent! Not only was there no squeeze out, but the solder was well-formed and especially shiny. Microsections confirmed the results and verify that the solder filled the well.

The impact of this experiment is most important. Instead of adding three additional soldering steps over the conventional approach, i.e., reflowing each side separately and then an additional soldering/forming step with subsequent soldering to attach the components; now only one additional soldering is needed if solder paste deposits on both sides are originally reflowed and formed at the same time.

An additional observation should be recorded.

The reflowed formed board should probably be quenched quickly. Quenching is reported to be metallurgically necessary for the following reasons:

a) Application of solder to the copper reportedly produces two intermediate phases or intermetallic zones between the Cu and the Sn-Pb alloy . . . $Cu_3Sn$ and $Cu_6Sn_5$. The attempt is made to keep such brittle intermetallic zones as thin as possible, because if the intermetallic phase should penetrate to the surface of the Sn-Pb layer, soldering becomes difficult and in the extreme, impossible.

b) Growth of this zone is a function of the temperature and the time at elevated temperatures. A short dwell time=a thin intermediate layer.

c) Excessive growth of this zone lessens ductility of the resultant Sn layer. Therefore, a short dwell time and a quick cool down are the primary objectives, and the process of this invention using the mesh clearly satisfies this requirement.

In this invention, the quick cool down is easily achieved in air without any detrimental effects merely by removing the loaded fixture from the heat transfer fluid. Should the capacity of any production heat treating receptacle require a varying quench, this can readily be realized by having receptacles of varying temperatures in series.

The following working examples are illustrative of the present invention:

TABLE I

VARIABLES EVALUATED IN FORMING THE SOLDER DEPOSIT

A- These experiments employed reflowed solder paste on the board with stainless steel plates [pressure transmitting surface unless otherwise noted] using a standard PCB in the test fixture, which was immersed in hot heat transfer fluid [a synthetic oil], at a temperature of 395 degrees F. unless otherwise noted.

| CONTACT FILM | RESULTS |
| --- | --- |
| "KAPTON" | foil formation |
| 4 mil "VACREL" | in a vacuum laminator; foil formation and severe curing and blistering of the "VACREL" |
| Rubber Bladder | in a vacuum laminator; foil formation and rubber residur on PCB |
| Silicone Rubber | in a vacuum laminator; foil formation with no residue |
| Aluminum Foil | solder foil formed with wrinkles |
| Aluminum Plates | foil formation and galvanized-like dull finish on the solder |
| Aluminum Plates highly polished | foil formation, solder finish was fine |
| Stainless Steel Plates | foil formation and the grain of the highly polished steel appeared on the solder; also required longer than normal dwell time and cool-down time |
| Glass Plates | produced a shiny and reflective solder surface; one could see the outgassing and foil formation as it developed |

B- In these experiments the temperature was varied, in degrees F., they were: 450, 425, 405 and 390. Temperatures from the softening point of solder to 405 degrees are adequate.
C- Dwell times were varied at intervals in minutes of 1, 2, 3, 4, and 5. 2-3 minutes appeared to be all that was necessary, although boards thicker than the standard 0.064 in., i.e., up to 0.125 in. took up to the full 4-5 minutes.
D- The use of a mesh covering the surface of the board resolved the problems of bubbles from outgassing, foil formation, discoloration of the solder, as well as an excess or deficiency of solder on the pad. All the above experiments were repeated using mesh and the same benefits were achieved. The other most important development was that not only were the results achieved with solid solder and solid solder resulting from the reflow of solder paste, but they were also realized from solder paste without being reflowed.

The foregoing description of the specific embodiments will so fully reveal the general nature of the invention that others can, by applying current knowledge, readily modify and/or adapt for various applications such specific embodiments without departing from the generic concept, and, therefore, such modifications and adaptations should and are intended to be comprehended within the meaning and range of equivalents of the disclosed embodiments. It is to be understood that the phraseology or terminology employed herein is for the purpose of description and not of limitation.

What is claimed is:

1. A process for the forming of solder deposits on surface mount device pads comprising the steps of:
   a) providing a printed circuit board having solder deposited on the pads;
   b) covering said board with a mesh material;
   c) placing said board with the mesh thereon between surfaces capable of uniform compression;
   d) pressing together said surfaces;
   e) placing said thus prepared circuit board at any orientation in a heat transfer fluid medium maintained at an elevated temperature whereby the solder melts;
   f) removing said circuit board from the medium;
   g) cooling said circuit board to ambient temperature while compressed; and
   h) removing said circuit board from between the compressive surfaces and the mesh.

2. The process of claim 1 wherein the printed circuit board is a hybrid circuit board.

3. The process of claim 1 wherein the solder deposited is selected from the group consisting of solid solder, solder paste, solder cream and solder powder.

4. The process of claim 1 wherein the steps of removing said circuit board from the medium and cooling further includes the steps of:
   a) containing the thus-melted solder within the approximate periphery of the pads;
   b) moving the thus-melted solder upwards and downwards within the mesh; and
   c) imprinting the mesh on the uppermost portion of the solder deposit.

5. The process of claim 1 wherein the mesh material includes counts of 60-300, (292-53 microns Standard Sieve Designation) and thicknesses, wire diameters and weaves consistent with this mesh count.

6. The process of claim 1 wherein the surfaces capable of uniform compression are selected from the group consisting of metal, plastic, glass and rubber.

7. The process of claim 1 further comprising a sheet of elastic material placed between the mesh material and the surfaces capable of uniform compression.

8. The process of claim 1 wherein the pressing is done at a pressure sufficient to form the solder.

9. The process of claim 1 wherein the heat transfer fluid is selected from the group consisting of natural oils and synthetic oils.

10. The process of claim 1 wherein the step of removing said circuit board from between the compressive surfaces and the mesh includes the step of releasing the surface and mesh from the formed solder.

11. The process of claim 1 wherein the heat transfer fluid includes the further property of protecting the printed circuit board including its components from degradation by heat.

12. The process of claim 1 wherein the elevated temperature is maintained between about 370-420 degrees Fahrenheit, sufficient to soften the solder.

13. The process of claim 12 wherein the thus prepared circuit board is maintained at the elevated temperature for about 2-5 minutes.

14. The process of claim 1 wherein the cooling is done in ambient air.

15. The process of claim 1 wherein the cooling is done by placing the heated, compressed circuit board in heat transfer media of progressively lower temperatures.

16. The process of claim 1 wherein the mesh material is selected from the group consisting of stainless steels, glass cloths, chemically milled screens, chemically milled plates and laser-machined plates.

17. A method for forming solder deposits on a printed circuit board having surface mount device pads with the solder deposits thereon, comprising the steps of:
   a) covering said printed circuit board with a mesh material;
   b) placing said mesh material covered printed circuit board between surfaces capable of uniform compression;
   c) pressing together said surfaces;

d) heating said thus-prepared printed circuit board uniformly at an elevated temperature such that the solder deposits melt;

e) cooling; and f) removing said cooled printed circuit board from between said mesh material and the compression surfaces constructed and arranged such that the solder deposits are contained within said pads.

18. The process of claim 1 wherein one of the compression surfaces is the mesh material itself stretched on a weighted chase constructed and arranged such that registration is maintained while forming the softened solder.

* * * * *